(12) United States Patent
Leitz et al.

(10) Patent No.: US 6,640,417 B2
(45) Date of Patent: Nov. 4, 2003

(54) METHOD FOR DETERMINING CORRECT PHASING OF A THREE-PHASE BRUSHLESS DC MOTOR

(75) Inventors: Jerry Leitz, New Milford, CT (US); John W. Sussmeier, Cold Spring, NY (US)

(73) Assignee: Pitney Bowes Inc., Stamford, CT (US)

( * ) Notice: Subject to any disclaimer, the term of this patent is extended or adjusted under 35 U.S.C. 154(b) by 126 days.

(21) Appl. No.: 10/022,106

(22) Filed: Dec. 13, 2001

(65) Prior Publication Data

US 2003/0110614 A1 Jun. 19, 2003

(51) Int. Cl.[7] .......................... H02K 15/00; G05B 19/29
(52) U.S. Cl. .............................. 29/596; 29/593; 318/600
(58) Field of Search .................. 29/596, 593; 318/592, 318/600, 652, 254, 138, 439, 720, 721, 722, 723, 724; 324/66, 117 R, 117 H, 118, 521

(56) References Cited

U.S. PATENT DOCUMENTS 5,847,521 A * 12/1998 Morikawa et al. .......... 318/254
5,990,642 A * 11/1999 Park ........................... 318/254

* cited by examiner

*Primary Examiner*—Carl J. Arbes
*Assistant Examiner*—Thiem D Phan
(74) *Attorney, Agent, or Firm*—Michael J. Cummings; Charles R. Malandra, Jr.; Angelo N. Chaclas

(57) ABSTRACT

A method for correctly connecting the wiring for the hall effect sensors and the motor phase terminals of a three-phase brushless DC motor to the corresponding connections on an amplifier, the method using known waveforms that describe the electrical operational characteristics of the motor and amplifier. The method comprising connecting the hall effect sensors in any order, determining two motor phase terminals that correspond to a back-electro-magnetic-force peak in the middle of a waveform for a first hall effect sensor and a third motor phase terminal that does not, determining an amplifier pin that does not carry current during the middle of a wave form for a first hall sensor input on the amplifier. The correct connection is thus determined to be between the third motor phase terminal and the identified amplifier pin. The remaining connections are determined in the same manner by repeating this process, but in relation to the other hall effect sensor waveforms.

6 Claims, 4 Drawing Sheets

AMPLIFIER WAVEFORMS

MOTOR WAVEFORMS

FIG.4

| (41) Selected Motor Hall Sensor | (42) Amplifier Hall Sensor Input Connection Pin | (43) Motor Terminals Experiencing a Peak BEMF (Fig. 3) | (44) Amplifier Phase Connection Pins Supplying Current (Fig. 2) | (45) Unused Motor Phase Terminal | (46) Unused Amplifier Phase Connection | (47) Connection determined between motor and amplifier |
|---|---|---|---|---|---|---|
| H1 | H1' | M3-M1 | A-C | M2 | B | M2-B |
| H2 | H2' | M2-M3 | B-A | M1 | C | M1-C |
| H3 | H3' | M1-M2 | C-B | M3 | A | M3-A |

METHOD FOR DETERMINING CORRECT PHASING OF A THREE-PHASE BRUSHLESS DC MOTOR

BACKGROUND OF THE INVENTION

Motion control engineers have long struggled with determining the correct wiring for phase and hall sensor relationships between three phase brushless DC motors and amplifiers. The problem becomes significant for development efforts on complex machines that require a plurality of different motors, amplifiers and manufacturers to adequately satisfy motion requirements. To aggravate the problem further, there is no standard nomenclature between hall and phase connections between motor and amplifier vendors. For three hall sensor wires, there are six possible connections between the motor and amplifier. Similarly, for three phase wires, there are six possible connections between the motor and amplifier. The net result is that there are 36 possible unique wiring combinations of which only six are correct. However, once any combination has been chosen for the hall wires, the problem becomes determining which one of the six possible motor combinations is correct (it is equally valid to connect the motor first and then determine which one of the six hall combinations is correct).

For correct motor phasing, current must be applied to each motor phase by the amplifier at the same moment in time that the back-electro-motive-force or BEMF, measured as voltage, for that motor phase is at a peak. A mechanical analogy is firing a spark plug when the piston is at the top of its stroke.

Conventional phasing methods use a trial-and-error approach in which the halls are attached to the amplifier, and then the correct motor wiring is determined by finding the combination that seems to run the best. Of the six possible combinations for a single set of hall connections, three of these will result in rotation that is the opposite of the hall signal rotation pattern and will not work at all. Of the remaining three, one will not turn the motor at all (current will flow through the windings but it will produce no torque), one will run the motor at reduced torque and one will be the correct connection. Trial-and-error methods have been demonstrated to be subject to error because it is sometimes difficult to determine which combination is best without the use of a dynomometer. In many cases, two out of the six possible phase wiring combinations will appear to run the motor satisfactorily, but only one is correct.

Phasing problems are particularly apparent in machines, such as high speed inserting machines for mass producing mailings, which use many brushless DC servo motors. In such machines, technicians may incorrectly phase one or more motor applications. Such incorrectly phased applications can commutate improperly for several months, resulting in elevated motor temperature and occasional software initiated motor stoppages due to excessive position error. Such stoppages can be incorrectly attributed to intermittent motor encoder failures because the motor's encoder value might intermittently fail to change when the motor is commanded to perform an aggressive acceleration. However, the encoder is not to blame when the rotor has become stalled at an angular position where a commutation switch point occurred. Incorrect commutation can result in reduced generated torque at a particular rotor position and the reduced torque might not overcome the sum of the motor cogging torque and friction load torque, resulting in rotor stall.

SUMMARY OF THE INVENTION

Using the present invention, proper phase wiring between the motor and amplifier can be determined without using trial-and-error techniques. The present invention requires that the user know the BEMF waveforms and hall sensor output relationships for the motor, and the phase current output waveforms and hall sensor input relationships for the amplifier. These relationships are typically depicted as a function of the rotor positions in electrical degrees. Proper phase wiring between the motor and the amplifier can be achieved by reconciling desired rotor positions that are commonly described by the known characteristics of both the motor and amplifier.

In accordance with the present invention, proper phase wiring is achieved using the following steps. First, hook the three hall sensor signal wires from the motor to the amplifier in any order. Next, referring to the known characteristics of the motor, for a first selected hall sensor find out which two motor phases (and their corresponding connections) produce a BEMF peak at the same rotor position (in electrical degrees) as the middle of a peak of the waveform for the first hall sensor signal. The polarity is not important at all, as a negative peak is just as good as a positive.

Then, referring to the known characteristics of the amplifier, for a first hall sensor input connected to the first hall sensor in the motor, determine which two amplifier phase connection pins are intended to provide current during the middle of a peak in the waveform for the first hall sensor input signal. Again, the polarity does not matter.

Based on these observations, it is determined that the two identified motor phase connections should be connected to the two identified amplifier pins, but it is not known which is which. However, regardless of the polarity, it is known that the third motor phase connection needs to be connected to the third amplifier pin because they form the unused phase connection for the portion of the motor's electrical cycle under consideration. Accordingly, the third motor phase connection should be connected to the third amplifier pin.

Next, this process is repeated for a second selected hall sensor. Again, for another portion of the motor's electrical cycle at the middle of a peak in the waveform for the second hall sensor's signal, two sets of motor and amplifier connections will be identified as providing current. The unused phase connection for that portion of the motor's electrical cycle will also be identified. Accordingly, the unused motor phase connection should be connected to the unused amplifier pin.

By process of elimination, the final unconnected motor phase connection must connect to the final amplifier phase connection pin. However, if desired the above process can be repeated with respect to the third and final hall sensor.

BRIEF DESCRIPTION OF THE DRAWINGS

FIG. 4 is a table including exemplary tabulations of data from FIGS. 2 and 3 for determining proper phase connections pursuant to the present invention.

DETAILED DESCRIPTION

Figure 1:
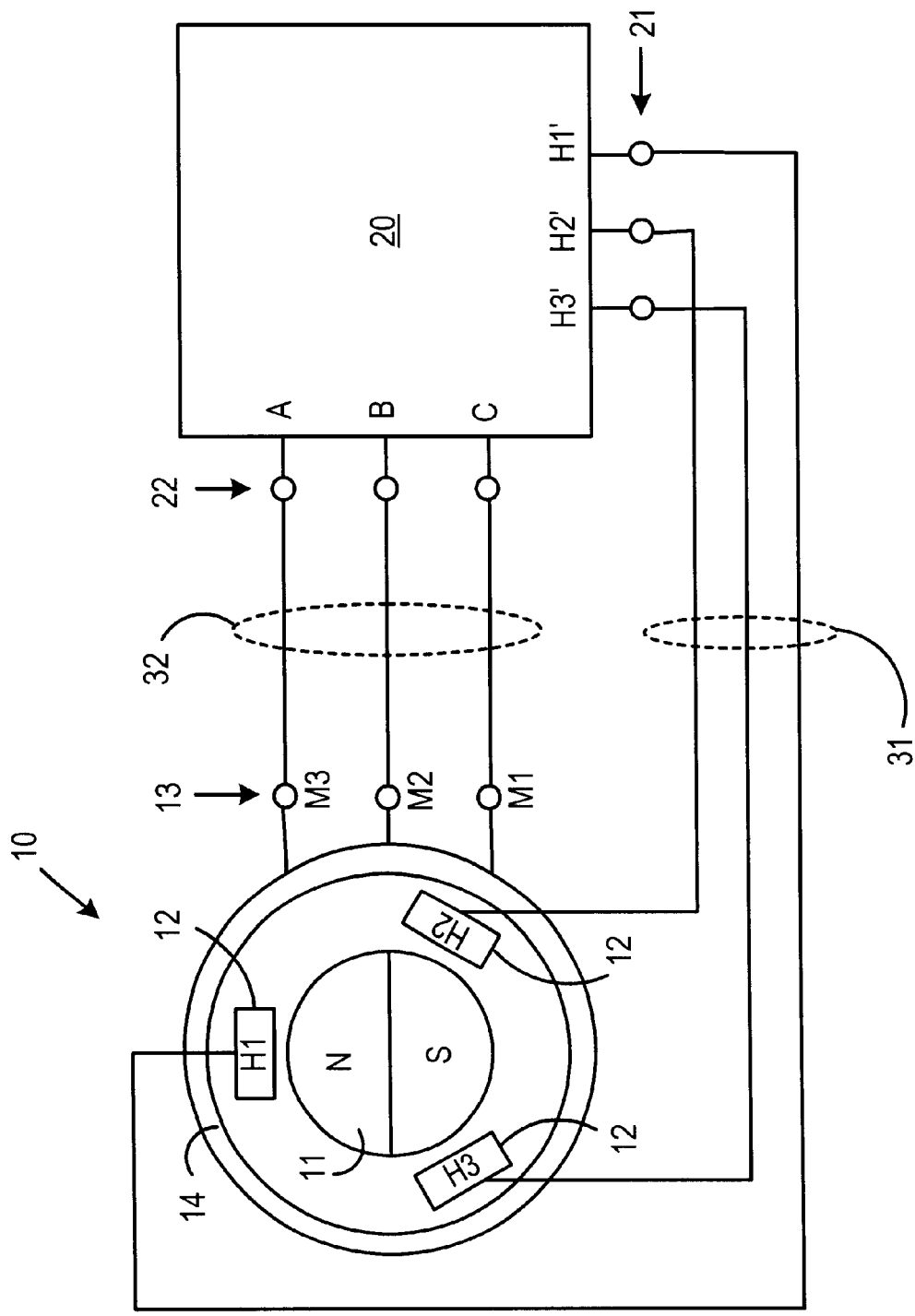
FIG. 1 is a simplified depiction of a typical three-phase brushless DC motor and amplifier for which the present invention is applicable.

FIG. 1 is a simplified depiction of a three-phase brushless DC motor 10 and a corresponding amplifier 20 for providing power to the motor stator 14 three phase windings.

Sequenced electric current supplied from amplifier 20 to the motor stator 14 windings, provides electromotive force to turn the magnetized rotor 11. Motor 10 also includes hall sensors 12 for detecting the position of the rotor 11 as it turns. The hall sensors 12 in FIG. 1 are individually designated H1, H2, and H3 respectively.

The hall sensors 12 are connected to the halls sensor inputs 21 of amplifier 20 by hall sensor wires 31. The hall sensor inputs 21 are designated H1', H2', and H3' respectively. From rotor position signals received at hall sensor inputs 21, amplifier 20 determines the appropriate timing for providing current to the three motor phases in order to achieve the desired torque and rotation for rotor 11. Electric current is supplied in sequence to the phases of motor 10 from amplifier 20, via amplifier phase connection pins 22 which connect to motor phase terminals 13 via phase power supply wires 32. In FIG. 1, the amplifier phase connection pins 21 are designated A, B, and C, and motor phase terminals 13 are designated M1, M2, and M3.

Figure 2:
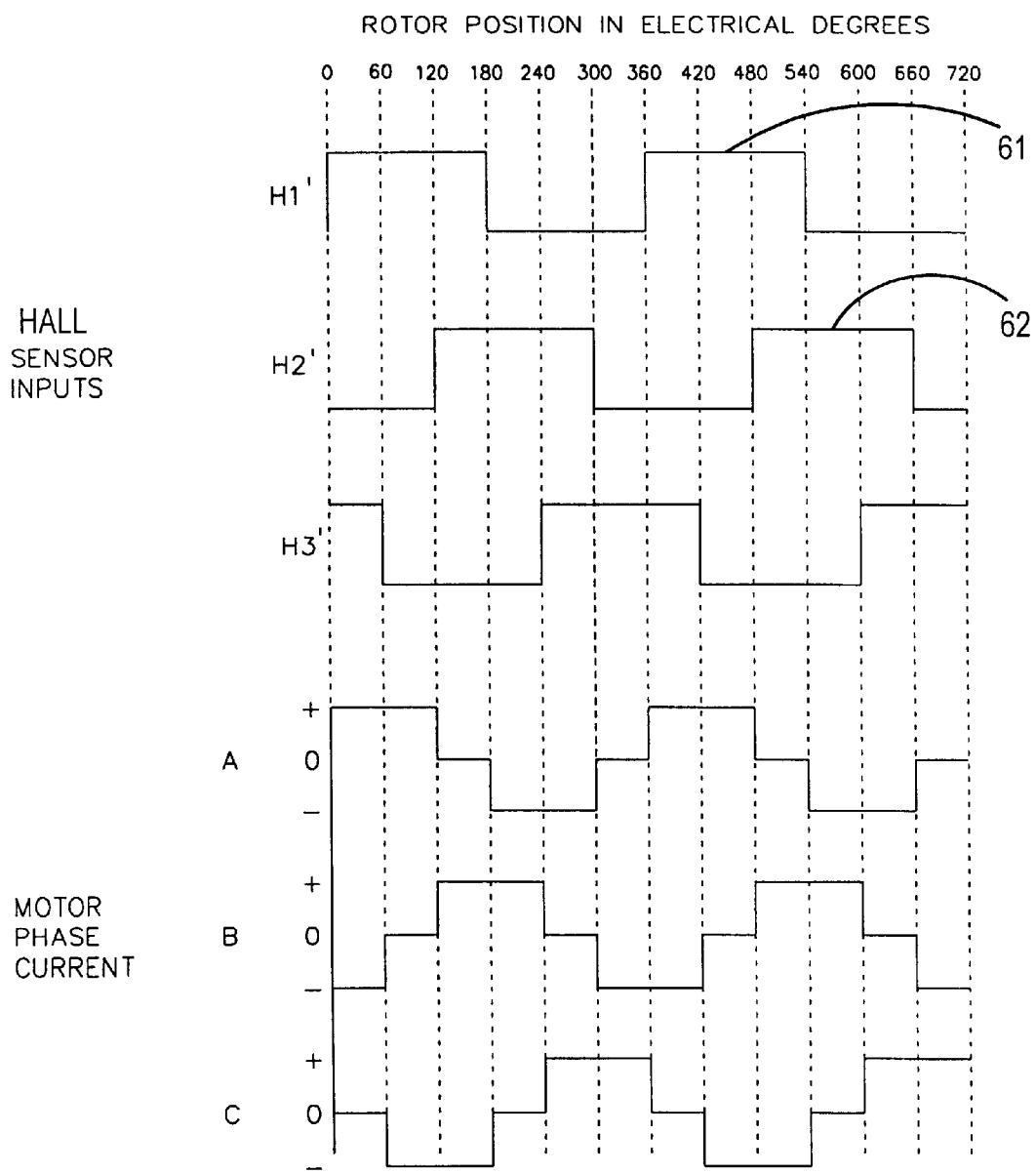
FIG. 2 depicts exemplary amplifier operational characteristics.
Figure 3:
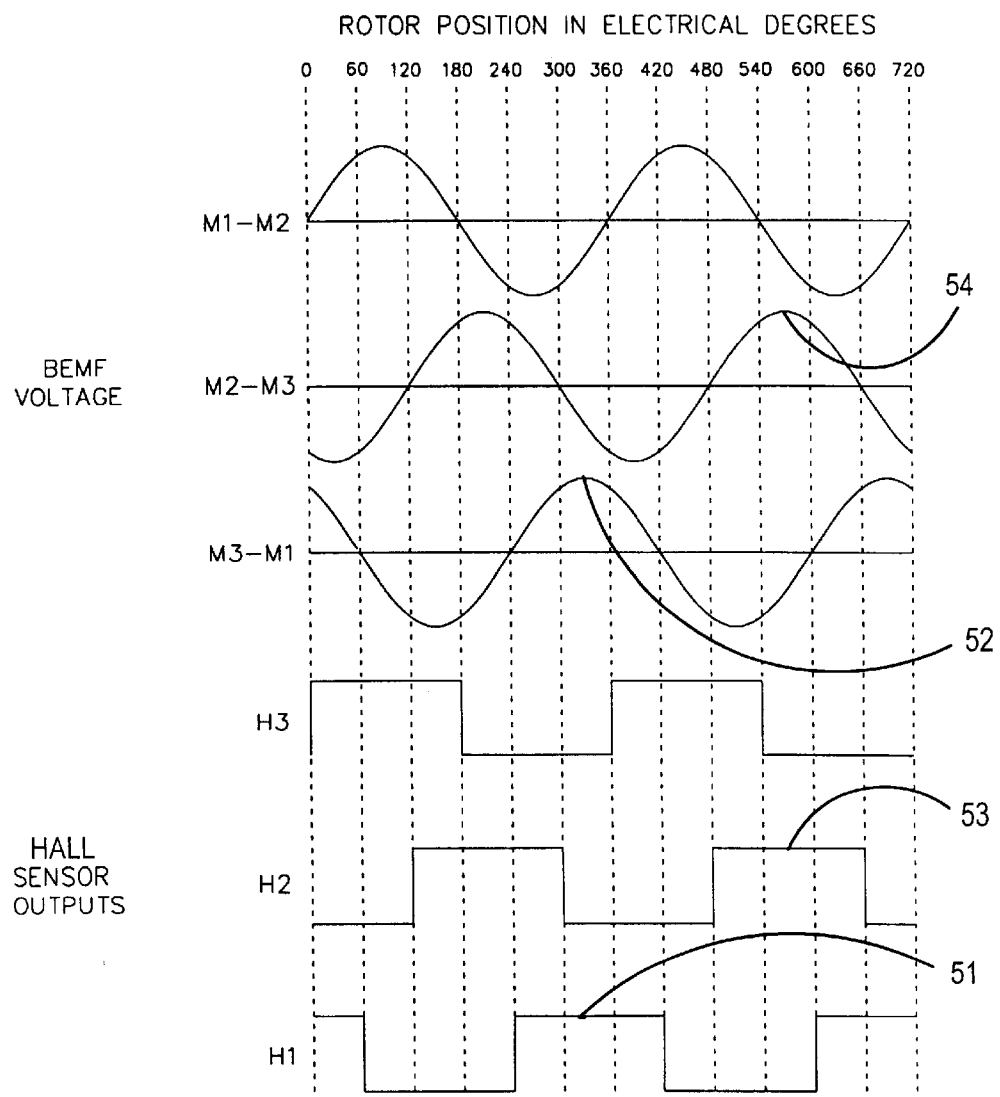
FIG. 3 depicts exemplary three-phase brushless DC motor operational characteristics.

In accordance with the present invention, correct phase wiring between motor 10 and amplifier 20 is preferably determined with reference to vendor provided information, typically be depicted as shown in FIGS. 2 and 3. Referring to FIG. 2, phase current output signal and hall sensor input signal relationships are taken from an amplifier manufacturer's application notes. The relationship between the sensor inputs (at H1', H2' and H3') and the phase current outputs (at A, B and C) are valid for all 60 degree hall, 6-step commutating amplifiers. FIG. 2 depicts the expected operational motor phase current with respect to the hall sensor inputs in terms of the position of the motor rotor 11 position in electrical degrees. In practice, amplifier vendor labels all vary and are not necessarily in logical order.

FIG. 3 provides the characteristics of for the three-phase brushless DC motor 10. In FIG. 3, BEMF waveforms and hall sensor outputs are shown for the motor in terms the position of the motor rotor in electrical degrees. In FIG. 2, the BEMF voltage is depicted as would be measure between pairs of the motor terminals M1, M2, and M3. FIG. 2, also show the hall sensor output wave forms for the motor hall sensors H1, H2, and H3.

The steps for implementing the present invention to achieve proper phase wiring are now explained using amplifier and motor characteristics depicted in FIGS. 2 and 3. Information gathered from FIGS. 2 and 3 may be tabulated as shown in FIG. 4 in order to facilitate the method.

First, connect the hall sensors (H1, H2, and H3) of the motor 10 to the halls sensor input terminals (H1', H2', and H3') of the amplifier 20. The wires 31 for the halls sensor connections between the motor 10 and the amplifier 20 can be in any order. The designations of the hall sensors 12 and the respective hall sensor inputs 21 may be arbitrary, however for the purpose of this explanation, the designations are as follows: hall sensor H1 connects to hall sensor input H1'; hall sensor H2 connects to hall sensor input H2', and hall sensor H3 connects to hall sensor input H3'. These hall sensors 12 and the respective amplifier sensor inputs 21 are listed in columns 41 and 42 of the table in FIG. 4.

Next, referring to FIG. 3, for a first selected hall sensor H1 find out which two motor phases (and their corresponding connection terminals 13) produce a BEMF peak at the same rotor 11 position (in electrical degrees) as the middle portion 51 of a peak of the waveform for the first hall sensor signal. The polarity is not important at all, as a negative peak is just as good as a positive. Looking at the waveform for hall sensor H1 in FIG. 3, it is seen that the middle portion 51 of the square wave occurs at a rotor 11 position of 300–360 electrical degrees. For the same rotor 11 position in electrical degrees it can be seen that a peak 52 occurs in the BEMF waveform between terminals M3-M1 when the rotor is at the position of 300–360 electrical degrees. Once again in looking at BEMF peaks, it does not matter whether the peak is positive or negative. Accordingly, for the row corresponding to hall sensor H1, the M3-M1 terminals are listed in column 43 of FIG. 4.

The reason looking at the middle of a peak of the waveforms for a hall sensor 12 is that in the middle of a high hall sensor signal during motor operation, the other two hall sensor signals are both low. This makes it much easier to find specific positions on the graphs, such as those in FIGS. 2 and 3. Also, if it is desired to determine which phases are active with an oscilloscope, the middle of any hall sensor waveform will always look the same regardless of the direction of rotation chosen (a rising hall sensor signal in one direction looks like a falling hall sensor signal if the motor is spun the other way). Using this technique, there is never a need to look at two hall sensor signals on the oscilloscope at the same time. If you look at the middle of the hall sensor signal, one at a time is always enough.

Alternatively, it is possible to use a portion of the hall sensor signal other than the middle, but choosing another location can add unnecessary complexity to the procedure. If another location is chosen, the direction of the rotor 11 rotation and the hall sensor signal polarity (+or −) need to be tracked in order to maintain a unique location common to both the amplifier and motor waveforms as shown in FIGS. 2 and 3.

For the next step, referring to FIG. 2 (the characteristics of the amplifier 20), for selected hall sensor input H1', determine which two amplifier phase connection pins (A, B or C) are intended to provide current during the middle portion 61 of a peak in the waveform for the H1' hall sensor input signal. Again, the polarity does not matter. From FIG. 2 it can be seen that amplifier connection pins A and C are providing current during the 60–120 electrical degree rotor position which corresponds to the middle portion of the square waveform for H1'. Accordingly, for the row corresponding to hall sensor H1 and hall sensor input H1', amplifier connection pins A and C are listed in column 44 of FIG. 4, as providing current for the portion 61 of the hall waveform currently being examined.

Based on the observations made so far, it is determined that motor terminals M3 and M1 and amplifier phase connection pins A and C should be connected in some order in order to operate properly during the portion of the cycle being considered, but, it is not known which active motor terminal connects to which amplifier phase connector pin. However, regardless of the polarity, the unused motor phase terminal M2 (as listed in column 45 of FIG. 4) needs to be connected to the unused amplifier pin B (listed in column 46 of FIG. 4), because they form the unused phase connection for the portion (shown at 51 and 61 in FIGS. 3 and 2 respectively) of the motor's electrical cycle under consideration. Accordingly, motor phase terminal M2 should be connected to amplifier pin B, as listed in column 47 of FIG. 4.

At this stage in the process one of the proper phase connections between the motor 10 and the amplifier 20 has been identified. Next, this process described above for hall sensor H1 is repeated for a second selected hall sensor H2. Referring to FIG. 3, it is seen that a BEMF voltage peak 54 for motor terminals M2-M3 corresponds to the middle portion 53 of the square waveform for hall sensor H2. Accordingly, those two motor terminals are entered into the table in FIG. 4 in column 43, for the row corresponding to hall sensor H2.

From FIG. 2 it is seen that for the middle portion 62 of the square wave corresponding to hall sensor input H2', electrical current is flowing in amplifier phase pins B and A. Accordingly, those two amplifier phase pins are identified in the appropriate row of column 44 of FIG. 4. Using the same process discussed above, it is readily determined that motor terminal M1 and amplifier phase connection pin C are not used during the portion (shown at 53 and 62) of the motor's electrical cycle being examined, as entered at columns 45 and 46 of FIG. 4. Thus a second proper phase connection is determined between motor terminal M1 and amplifier phase connection pin C, as entered in column 47 of FIG. 4.

With two of the three proper connections determined, by default the remaining phase connections for the motor 10 and amplifier 20 must be the correct connections for one another. Accordingly, motor terminal M3 should be connected to amplifier phase connection pin A, as listed in column 47 of FIG. 4. Alternatively, the process described above may be repeated for the waveforms corresponding to hall sensor H3, and the same result should be achieved. Thus, the three proper connections for the exemplary data provided in FIGS. 2 and 3 is shown in column 47 of FIG. 4. Note, however, that these connections are only valid when the amplifier hall sensor inputs H1', H2' and H3' are connected to motor hall sensors H1, H2 and H3, respectively, as described in the example above. The three hall sensors 12 could have actually been connected five other different ways, but by using this methodology for any combination, the correct results will be achieved.

An advantage of the process described above is that instead of a direct substitution method, the describe method permits the polarity of the BEMF peaks and the direction of current flow in the windings to be irrelevant for the procedure.

FIGS. 2 and 3 illustrate actual amplifier 20 and motor 10 waveforms as supplied by their respective vendors. If the motor vendor does not provide this information, the BEMF and hall sensor relationships can be determined by mechanically back-driving the motor 10 and capturing the waveforms for each of the three phases and hall sensors 11 on an oscilloscope. Back-driving the motor 10 can also provide the added benefit of confirming that the motor phase stator windings 14 are properly phased with the hall sensors 11, i.e. the zero crossings for the BEMF waveforms should line up with the rising and falling hall sensor outputs. In practice, during the motor selection process for the high speed-inserting machine mentioned previously, information provided by motor vendors has been found to contain errors in describing BEMF waveforms and their respective hall sensors 11 outputs. Such errors can result in significantly reduced rated output torque from the rated torque that the vendors advertised in their data sheets.

Although the present invention has been described with emphasis on a particular embodiment, it should be understood that the figures and data provided are for illustration of the exemplary embodiment of the invention and should not be taken as limitations or thought to be the only means of carrying out the invention. Further, it is contemplated that changes and modifications may be made to the steps of the invention without departing from the scope and spirit of the invention as disclosed.

What is claimed is:

1. A method for correctly connecting a three-phase brushless DC motor to an amplifier; the motor comprising a rotor, three hall sensors, and three motor phase terminals; the amplifier comprising three hall sensor inputs, and three amplifier phase connections; the method steps comprising:
   connect the three hall sensors to the three hall sensor inputs, whereby a first hall sensor is connected to a first hall sensor input, a second hall sensor is connected to a second hall sensor input, and a third hall sensor is connected to a third hall sensor input;
   identify a first portion of a rotor's electrical cycle corresponding to a middle of a peak for an output signal from the first hall sensor;
   identify a first pair of the three motor phase terminals for which there is a peak back-electro-motive-force during the first portion of the rotor's electrical cycle, the first pair of motor phase terminals comprising a second and a third motor phase terminal, and whereby a first motor phase terminal is different from the second and third motor phase terminals;
   identify the first portion of the rotor's electrical cycle corresponding to a middle of a peak for an input signal for the first hall sensor input;
   identify a first amplifier phase connection, of the three amplifier phase connections, through which no electric current flows during the first portion of the rotor's electrical cycle; and
   connect the first motor phase terminal to the first amplifier phase connection.

2. The method of claim 1 the steps further comprising:
   identify a second portion of the rotor's electrical cycle corresponding to a middle of a peak for an output signal from the second hall sensor;
   identify a second pair of the three motor phase terminals for which there is a peak back-electro-motive-force during the second portion of the rotor's electrical cycle, the second pair of motor phase terminals comprising the first and the third motor phase terminals, and whereby the second motor phase terminal is different from the first and the third motor phase terminals;
   identify the second portion of the rotor's electrical cycle corresponding to a middle of a peak for an input signal for the second hall sensor input;
   identify a second amplifier phase connection, of the three amplifier phase connections, through which no electric current flows during the second portion of the rotor's electrical cycle; and
   connect the second motor phase terminal to the second amplifier phase connection.

3. The method of claim 2 the steps further comprising:
   connect the third motor phase terminal to a third amplifier phase connection, of the three amplifier phase connections, different that the first or the second amplifier phase connections.

4. The method of claim 1 wherein the steps to identify a first portion of the rotor's electrical cycle corresponding to the middle of the peak for the output signal from the first hall sensor, and to identify the first pair of the three motor phase terminals for which there is the peak back-electro-motive-force during the first portion of the rotor's electrical cycle, further comprise the step of:
   referring to predetermined motor characteristics relating to hall sensor output signals for the three hall sensor, and to back-electro-motive force signals for pairs of the three motor phase terminals.

5. The method of claim 4 wherein the predetermined motor characteristics are obtained by the steps of:

backdriving the motor; and capturing waveforms for the three hall sensors and the three motor phase terminals on an oscilloscope.

6. The method of claim 1 wherein the steps to identify the first portion of the rotor's electrical cycle corresponding to the middle of the peak for the input signal for the first hall sensor input, and to identify the first amplifier phase connection, of the three amplifier phase connections, through which no electric current flows during the first portion of the rotor's electrical cycle, further comprise the step of:

referring to predetermined motor characteristics relating to hall sensor input signals for the three hall sensor inputs and to current signals for the three amplifier phase connections.

* * * * *